United States Patent [19]
Jeon et al.

[11] Patent Number: 5,748,550
[45] Date of Patent: May 5, 1998

[54] MULTIPLE POWER LINE ARRANGEMENT FOR A SEMICONDUCTOR MEMORY DEVICE

[75] Inventors: Jun-Young Jeon, Seoul; Pil-Soon Park, Suwon, both of Rep. of Korea

[73] Assignee: Samsung Electronics Co., Ltd., Suwon, Rep. of Korea

[21] Appl. No.: 759,567

[22] Filed: Dec. 4, 1996

[30] Foreign Application Priority Data

Dec. 4, 1995 [KR] Rep. of Korea ............... 95-46426

[51] Int. Cl.$^6$ ..................................... H01L 27/10
[52] U.S. Cl. ........................ 365/226; 365/51; 365/63; 257/774; 257/758; 257/776; 257/206; 257/207; 257/208; 257/211
[58] Field of Search ................... 365/226, 51, 63; 257/774, 758, 776, 206, 207, 208, 211

Primary Examiner—Vu A. Le
Attorney, Agent, or Firm—Jones & Volentine, LLP

[57] ABSTRACT

A method and system for arranging power lines of a semiconductor memory device in order to prevent cracking of the power lines and to reduce resistance of the power lines without the provision of slits in the power lines. A first metal and a second metal for a first power line are connected to each other by contacting the first metal with the second metal; a first metal and a second metal for a second power line are also connected to each other by contacting the first metal with the second metal; the first metal for the first power line and the first metal for the second power line are arranged adjacent to each other; the second metal for the first power line and the second power line for the second power line are also arranged adjacent to each other; and the second metal of the first power line partially overlaps both the first metal for the first power line and the first metal for the second power line. No slits are provided between the first metals for the first and second power lines and the second metals therefor.

10 Claims, 1 Drawing Sheet

MULTIPLE POWER LINE ARRANGEMENT FOR A SEMICONDUCTOR MEMORY DEVICE

BACKGROUND OF THE INVENTION

1. Field of the Invention

The present invention relates generally to a semiconductor memory device. More particularly, it relates to a method and system for arranging power lines in the semiconductor memory device in order to reduce its resistance and to prevent cracking therein. The present application is based upon Korean Application No. 46426/1995, filed Dec. 4, 1995, which is incorporated herein by reference.

2. Description of the Related Art

In general, two kinds of external source voltages VCC and VSS are used as the external power supply voltage for a semiconductor memory device, in which VCC is a power supply source voltage and VSS is a ground source voltage. In addition, various other kinds of source voltages are generated internally within the memory device. Such external power source voltages and the other internally generated source voltages are supplied to each circuit component via respective power lines. Conventionally, the arrangement of theses power lines is such that a first metal is used for a first power line, a second metal is used for a second power line, and the first metal is also used for a third power line, the first metal being disposed in a separate layer from the second metal with a dielectric material interposed therebetween. These power lines are usually designed so as to have a maximum possible width so as to reduce the resistance therein. However, an increase in the width of the power line is accompanied by a tendency for the power line to develop cracks therein due to the electromigration of electrons which occurs upon excessive current flow of the memory device.

FIG. 1 show an arrangement of power lines according to a prior art, which includes a first metal 1 for a first power line for supplying power source voltages by being positioned on the surface of the chip; a second metal 2 for a second power line; a first metal slit 50 having a square or polygon shape within the first metal 1; and a second metal slit 60 also having a square or a polygon shape within the second metal 2. The slits 50 and 60 are generally added to the power lines in order to prevent cracking from occurring in the power lines and are disposed in a vertical direction of the power lines. Additionally, such slits are shaped in the form of a square or a polygon. However, since the edges of these slits are affected with stresses due to processing difficulties, other cracks may be generated as a result.

SUMMARY OF THE INVENTION

Accordingly, it is an object of the present invention to provide a method and system for arranging power lines of a semiconductor memory device in order to prevent cracking therein, as well as to reduce the resistance thereof, without the use of slits in the power lines.

To achieve the above object, the present invention is directed to a method for arranging power lines which supply external power source voltages into a semiconductor memory device, the power lines each providing a power source voltage which is different from the other in an exterior of a device chip, the method including the steps of: connecting a first metal and a second metal for a first power line to each other by contacting the first metal with the second metal; connecting a first metal and a second metal for a second power line to each other by contacting the first metal with the second metal; arranging the first metal for the first power line so as to be adjacent the first metal for the second power line; arranging the second metal for the first power line so as to be adjacent the second metal for the second power line; and overlapping the second metal of the first power line with the first metal for the second power line, whereby there are no slits within the first metals for the first and second power lines and the second metals for the first and second power lines.

The present invention is also directed to a multiple power line system which supplies external power source voltages into a semiconductor memory device, said power lines each providing a power source voltage which is different from the other in an exterior of a chip, die system including: first and second metals for a first power line which are connected to each other such that the first metal for the first power line is in electrical contact with the second metal for the first power line; and first and second metals for a second power line which are connected to each other such that the first metal for the second power line is in electrical contact with the second metal for the second power line; wherein the first metal for the first power line is located adjacent to the first metal for the second power line; wherein the second metal for the first power line is located adjacent to the second metal for the second power line; and wherein the second metal for the first power line partially overlaps both the first metal for the first power line and the first metal for the second power line.

BRIEF DESCRIPTION OF THE DRAWINGS

These and various other features and advantages of the present invention will be readily understood with reference to the following detailed description taken in conjunction with the accompanying drawing, in which.

DETAILED DESCRIPTION OF THE PREFERRED EMBODIMENTS

Now, a preferred embodiment of the present invention will be discussed in detail with reference to the accompanying drawings.

Figure 1:
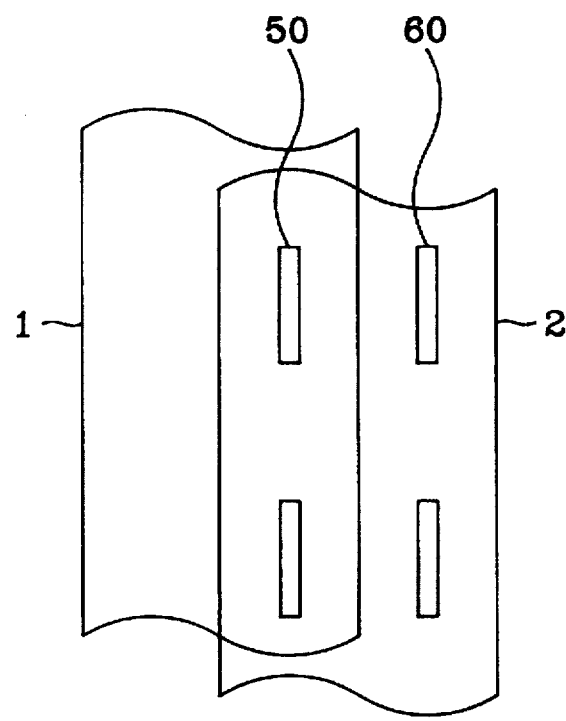
FIG. 1 shows a power line arrangement according to a prior art.
Figure 2:
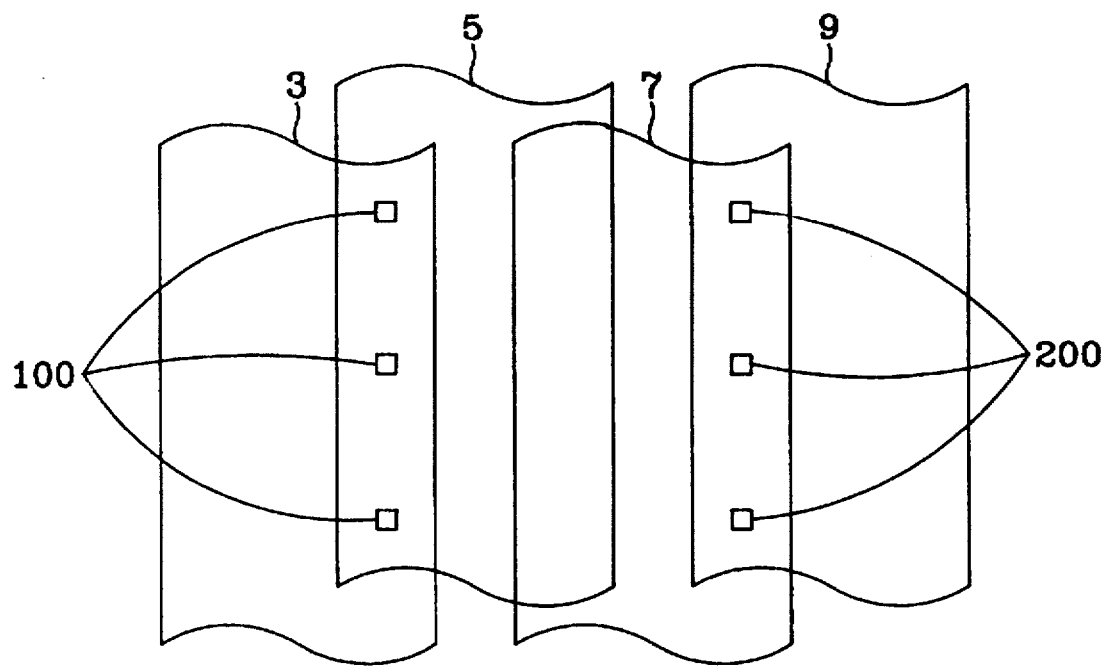
FIG. 2 shows a power line arrangement according to the present invention.

FIG. 2 shows a power line arrangement according to the present invention. In FIG. 2, a first power line on the surface of the chip is formed at a portion where a first metal 3 and a second metal 5 overlap each other, the first metal 3 and the second metal 5 mutually connected with each other by via contacts 100. Similarly, a second power line is formed at the portion where a first metal 7 and a second metal 9 overlap each other, the first metal 7 and the second metal 9 being mutually connected with each other by via contacts 200.

That is, the first power line includes the portion where the first metal 3 and the second metal 5 overlap each other and are connected through the via contacts 100, and the second power line includes the portion where the first metal 7 and the second metal 9 overlap and are connected through the via contacts 200. Also, the first metal 3 for the first power line and the first metal 7 for the second power line are disposed adjacent to one another, and the second metal 5 for the first power line and the second metal 9 for the second power line are disposed adjacent to one another. The second metal 5 for the first power line is arranged to overlap both the first metal 3 for the first power line and the first metal 7 for the second power line, whereas the first metal 7 for the second power line is arranged to overlap both the second metal 5 for the first power line and the second metal 9 for the second power line.

In the configuration described above, the width of each power line is divided into the first metal and the second metal by the overlapping thereof, thereby reducing the width of the lines of the first metal and the second metal to a half of them. As a result, advantageous effects are provided in that the generation of cracking can be prevented while at the same time the resistance in the power line can be reduced.

While the present invention has been described with reference to a specific embodiment, the description is illustrative of the invention and is not to be construed as limiting the invention. Various modifications may occur to those skilled in the art without departing from the true spirit and scope of the invention as defined by the appended claims.

What is claimed is:

1. A method for arranging power lines which supply external power source voltages into a semiconductor memory device, said power lines each providing a power source voltage which is different from the other in an exterior of a chip, comprising the steps of:

connecting first and second metals for a first power line to each other by contacting said first metal for said first power line with said second metal for said first power line;

connecting first and second metals for a second power line to each other by contacting said first metal for said second power line with said second metal for said second power line;

arranging said first metal for said first power line so as to be adjacent said first metal for said second power line;

arranging said second metal for said first power line so as to be adjacent said second metal for said second power line; and arranging said second metal for said first power line so as to partially overlap both said first metal for said first power line and said first metal for said second power line;

whereby there are no slits provided between said first and said second metals for said first and second power lines.

2. The method as claimed in claim 1, wherein said first power line and said second power line are different from each other.

3. The method as claimed in claim 1, wherein said first power line and said second power line are the same as each other.

4. The method as claimed in claim 1, wherein said first power line and said second power line are respectively different kinds of power lines.

5. The method as claimed in claim 1, wherein said first metals and said second metals are contacted with each other by using via contacts.

6. A multiple power line system which supplies external power source voltages into a semiconductor memory device, said power lines each providing a power source voltage which is different from the other in an exterior of a chip, said system comprising:

first and second metals for a first power line which are connected to each other such that said first metal for said first power line is in electrical contact with said second metal for said first power line; and first and second metals for a second power line which are connected to each other such that said first metal for said second power line is in electrical contact with said second metal for said second power line;

wherein said first metal for said first power line is located adjacent to said first metal for said second power line;

wherein said second metal for said first power line is located adjacent to said second metal for said second power line; and wherein said second metal for said first power line partially overlaps both said first metal for said first power line and said first metal for said second power line.

7. The system as claimed in claim 6, wherein said first power line and said second power line are different from each other.

8. The system as claimed in claim 6, wherein said first power line and said second power line are the same as each other.

9. The system as claimed in claim 6, wherein said first power line and said second power line are respectively different kinds of power lines.

10. The system as claimed in claim 6, wherein said first metals and said second metals are contacted with each other by via contacts.

* * * * *